(12) United States Patent
Aves

(10) Patent No.: US 7,054,795 B1
(45) Date of Patent: May 30, 2006

(54) METHOD FOR SELECTING OPTIMIZED LENGTHS OF A SEGMENTED TRANSMISSION LINE AND A TRANSMISSION LINE RESULTING THEREFROM

(75) Inventor: Donald Aves, Englishtown, NJ (US)

(73) Assignee: MYAT Inc., Norwood, NJ (US)

( * ) Notice: Subject to any disclaimer, the term of this patent is extended or adjusted under 35 U.S.C. 154(b) by 487 days.

(21) Appl. No.: 09/320,303

(22) Filed: May 26, 1999

(51) Int. Cl.
*G06F 17/10* (2006.01)
*G06F 17/50* (2006.01)
*H01P 1/10* (2006.01)

(52) U.S. Cl. ............... 703/2; 703/13; 703/14; 703/18; 333/104

(58) Field of Classification Search .......... 703/13–14, 703/18, 2; 333/104
See application file for complete search history.

(56) References Cited

U.S. PATENT DOCUMENTS

| | | | |
|---|---|---|---|
| 3,763,445 A | 10/1973 | Hannaford et al. ....... 333/31 R |
| 3,796,948 A * | 3/1974 | Wentworth ................. 324/630 |
| 4,019,162 A | 4/1977 | Banning ...................... 333/96 |
| 4,041,420 A * | 8/1977 | Riblet .......................... 333/35 |
| 4,831,346 A | 5/1989 | Brooker et al. ............. 333/260 |
| 4,988,961 A | 1/1991 | Schadler ...................... 333/26 |
| 5,025,402 A * | 6/1991 | Winkelstein ................ 703/14 |
| 5,097,232 A * | 3/1992 | Stopper ....................... 333/104 |
| 5,218,326 A | 6/1993 | Fleming-Dahl ............. 333/33 |
| 5,436,846 A | 7/1995 | Fleming-Dahl ............. 364/481 |
| 5,455,548 A | 10/1995 | Grandchamp ............... 333/260 |
| 5,719,794 A | 2/1998 | Altshuler et al. ........... 364/578 |
| 5,946,482 A * | 8/1999 | Barford et al. .............. 703/14 |
| 5,999,071 A | 12/1999 | Ostertag ...................... 333/245 |
| 6,081,160 A * | 6/2000 | Custer et al. ............... 330/286 |

OTHER PUBLICATIONS

Huss; "A mathematical and lumped-element model for multiple cascaded lossy transmission lines with arbitrary impedances and discontinuities"; IEEE ISCAS; pp. 1844-1847; May 1995.*

Celik et al.; "An all-purpose transmission line model for interconnect simulation in SPICE"; IEEE Trans. Microwave Theory & Tech.; pp. 1857-1867; Oct. 1997.*

Levy; "General synthesis of asymmetric multi-element coupled transmission-line directional couplers"; IEEE Trans. microwave theory and tech.; pp. 226-237; 1963.*

Mao et al.; "Synthesis of coupled transmission lines"; IEEE Trans. Circuits and Systems I: Fundamental Theory and Appl.; pp. 327-337; 1997.*

Ishii et al.; "Matching analysis by voltage standing waves"; Proc. 34$^{th}$ Circuits and Systems; pp. 748-751; 1991.*

* cited by examiner

*Primary Examiner*—Hugh Jones
(74) *Attorney, Agent, or Firm*—Milde & Hoffberg, LLP

(57) ABSTRACT

A method for optimizing the segment lengths of a segmented transmission line, comprising the steps of modeling the electrical performance of the segmented transmission line, and evaluating the model for incremental changes in electrical performance, selecting a set of segment lengths which meets a set of predefined optimization criteria. The predefined optimization criteria is, for example, minimum peak VSWR.

31 Claims, 12 Drawing Sheets

METHOD FOR SELECTING OPTIMIZED LENGTHS OF A SEGMENTED TRANSMISSION LINE AND A TRANSMISSION LINE RESULTING THEREFROM

FIELD OF THE INVENTION

The present invention relates to the field of segmented transmission lines, and more particularly to the field of high power air-spaced coaxial transmission lines for transmitting a radio frequency modulated broadcast signal to an antenna mast.

BACKGROUND OF THE INVENTION

For various high power applications, e.g., UHF television transmission, it is conventional to couple RF power between the transmitter and the antenna through a rigid coaxial transmission line. Further, in some applications, the transmitter may be located a substantial distance from the antenna so that the transmission line is necessarily made up of multiple sections. Conventionally, such multi-section runs are made up of sections which are essentially all of the same length, since this simplifies design and manufacturing. To prevent accumulating interference effects, the length of each section is normally selected so as to not be a multiple of a half wavelength of the frequency corresponding to the channel allocation for the particular television station. In some instances however, an antenna may be operated at a variety of frequencies within a substantial band, and this prior art technique may be ineffective in preventing reflections accumulating to an unacceptable voltage standing wave ratio (VSWR).

The VSWR (numeric ratio) is directly related to the return loss (in dB=20 $\log_{10}$(VSWR+1/VSWR-1) and reflection coefficient (VSWR-1/VSWR+1), and these terms are used interchangeably, with an appropriate change of units.

It is thus well known that discontinuities in a transmission line lead to impedance mismatches and "reflections". Where the discontinuities are evenly spaced over multiple segments, the effects of the discontinuities may be additive, resulting in significant degradation in performance of certain channels within a broadcast band.

Rigid coaxial transmission line systems are assembled from multiple sections of copper line and appropriate connectors. The connection points do not have the same characteristics as the continuous portions of the copper lines. Practical fabrication methods and physical constraints do not allow for "transparent" couplings, i.e., those which do not affect electromagnetic wave transmission. When equal stock lengths are used in a system, the connection discontinuities add up to produce non-usable portions of the frequency band. More than 70% of the span is unaffected, as the reflections from the discontinuities are selective. Typically, a minimum number of lines may be used without regard before the reflections become a problem.

The primary area where rigid lines are used is terrestrial television and FM radio signals between the transmitter amplifier and antenna mast. When the portion of the frequency band that is affected by connector reflections falls on a particular station's frequency, an alternate stock length is chosen for the system. When many low power stations wish to operate on the same line, levels permitting, more than half the systems can be accommodated with stock line lengths. A special length can be supplied to cover any group of known stations.

The rare time when the station frequencies are unknown, methods of displacing the reflection buildup can be applied. However, there is a price to pay. When systems of common length lines are used, all of the connector reflections appear at fixed positions: with only residual line reflections in band. Any method that distributes the reflections ends up with a complex addition of joint reflections and line discontinuities.

Reflection coefficients greater than 0.05 are known to degrade NTSC (analog television) service, while Bit Error Rates (BER) become a problem on HDTV (High definition Television, digital television). Typical reflection coefficients, for fixed length line systems in operation, are 0.01 to 0.03, while distributed length line systems are 0.03 to 0.05. The small degradation in picture quality is a tradeoff made for the ability to operate multiple stations with complex carrier frequency spacing.

U.S. Pat. No. 5,455,548, expressly incorporated herein, relates to a rigid coaxial transmission line, which seeks to achieve low Vertical Standing Wave Ratio (VSWR) characteristics over a frequency band by providing a "progressive distribution" of line lengths. Therefore, the individual segment line lengths are distributed essentially according to the formula:

$l = L + (\lambda(n-1))/(2N)$ for $n=1$ to $N$.

This formula, thus provides a deterministic formula for a priori defining the line lengths, presuming that an even distribution of impedance discontinuity effects by incremental spacing is optimal. A particular advantage of this type of system is that only the operating wavelength, overall run length and number of segments need be known in order to determine all of the individual line lengths.

Therefore, U.S. Pat. No. 5,455,548, proposes distributing the length of the transmission line segments linearly across a range so that the respective reflections from the ends of each transmission line segment do not superpose with each other causing an increase in VSWR in a particular portion of the band. While the design proposed by U.S. Pat. No. 5,455,548 does indeed reduce the maximum VSWR for any wavelength within the band, as compared to equal length segments, there still exists significant degradation of the transmitted signal.

U.S. Pat. No. 5,719,794, expressly incorporated herein by reference, provides a method for optimizing an antenna using a computerized process for the design of wire antennas using a genetic algorithm in conjunction with an electromagnetic code. The process designs antennas using a completely deductive approach; that is, the desired electromagnetic properties of the antenna are specified and the physical configuration that most closely produces these results is then synthesized. The only constraints on the antenna design are its size and any other relevant constraints (such as materials to use, e.g. thin wires). The genetic algorithm is applied in a multi-step process. In the first step, the electromagnetic properties of the desired antenna are specified. These properties can include, but are not limited to the radiation pattern, frequency range, polarization and input impedance. In the second step, a genetic algorithm and a suitable electromagnetic code are selected. The electromagnetic code computes the resulting antenna prospectives from each wire configuration designated by the genetic algorithm. A cost function is formulated, with or without computer assistance, which will return a single number for a given trial. This number is a figure of merit of the input desired characteristics. The user or computer determines the constraints of the design space (e.g. size, shape, number of design points, maximum lengths of wire, number of wire segments). Some or all of the constraints can be made a part of the genetic string itself. The number of bits to use in the genetic strings and the method of translating the strings into design features/characteristics (e.g. points in space, wire locations, type of feature) are specified, making sure the genetic string will not produce errors that are going to crash the simulation and/or are not accounted for in the cost function. All other genetic algorithm parameters—size of the population, number of generations, etc.—are specified by the user. The process is started and runs to completion as defined by either the computer or user, and the optimum design is output in some form (file, text, etc.) when the program has finished its run.

U.S. Pat. No. 4,831,346, expressly incorporated herein by reference, relates to coaxial transmission lines, for example coaxial cables which are somewhat flexible so that they can be used in installations which require the transmission line to bend. The coaxial cable assembly, o at least the outer conductor thereof, is fabricated and shipped in relatively short lengths (e.g., thirty-nine feet) rather than long lengths wound on reels. These lengths are generally of even length, and are coupled to function like a continuous cable after it has been assembled and installed.

U.S. Pat. No. 5,436,846, expressly incorporated herein by reference, proposes a method for analyzing a microwave system seeking to yield mutually consistent values for the insertion loss and the voltage standing wave ratio or return loss of the system, as well as heat losses, based solely on knowledge of the insertion loss and voltage standing wave ratio performance of the individual constituent components of the system.

U.S. Pat. No. 3,763,445, expressly incorporated herein by reference, discloses a variable length transmission line. U.S. Pat. No. 4,988,961, expressly incorporated herein by reference, provides an antenna coupler for reducing mismatch in an antenna "T" coupler. U.S. Pat. No. 4,019,162, expressly incorporated herein by reference, relates to a Coaxial transmission line with reflection compensation.

SUMMARY OF THE INVENTION

The present invention therefore provides a method for optimizing a segmented transmission line and a transmission line so optimized, which defines a model of the system, and spaces the segments to minimize the signal perturbations though the transmission line based on the optimization parameters. Thus, no simple formula is applied to define the segment lengths. Further, it has been found that the resulting distribution of segment lengths may have a substantially non-linearly increment.

The performance of the resulting optimized segmented transmission line is superior to that achieved with either a uniform segment length or an incrementally spaced segment length transmission line.

It is noted that, while the present invention was developed for high power broadcast transmission lines, the techniques, in principle may be applied to any system in which transmission line effects are applicable. Thus, microwave systems, integrated circuit layout, computer networks, printed circuit boards and connectors, optical communications systems, are but a few of the known systems which have defined segments which are subject to reflective boundaries thereat, resulting in potential performance degradation.

Computer Linear circuit simulation or network analysis is the analytical solution for the response of electrical components to an applied stimulus. Transformations of circuit parameters according to Laplace, Thevenin and Norton, allow the generation of transfer functions to create a system of equations. Unknowns are derived by Matrix methods to solve the equations then manipulated to produce s-parameters that completely describe the response of the network ports.

The available engineering analysis programs relieve the Engineer from the solution and presentation or graphics phase, and allows for full concentration on the problem. A library of components, that includes assemblies of components like transmission line sections, is provided to characterize and assemble into a model. When a component is not in the library, s-parameters of an actual physical component can be incorporated into the model as a ported Black Box. Parameters of an elbow, filter or antenna can be added to analyze a complete system. A full understanding of the assembly is required to interpret the parameters and results.

The method according to the present invention, therefore makes no incremental spacing presumption. An optimized set of line lengths is calculated based on a model of the system, with an optimization parameter addressing the electrical characteristics of the resulting system. This simulation does not depend on any particular increment of line lengths, and indeed the starting condition of the model simulation may be equal line lengths. The vector calculus employed by the model references stepped impedance, attenuation, dielectric constant, and capacitive discontinuity at each segmental connector, as well as the desired bandwidth, individual line length, and total run length.

For example, it may be desired to build a transmission line with 20 sections, have minimum VSWR contribution from flange connections and operate over the UHF TV band. From the prior art, it is known that lengths spread over a 6 inch range will reduce flange discontinuities. Accordingly initial lengths will range from 240 to 234 inches. Connections are made by combining nodes, consecutively assigned to each component. Input and Output Ports are connected by node numbers assigned to the first and last transmission line model components. Each transmission line segment is similar in performance, other than variations resulting from differences in length. The length, dielectric constant, impedance, attenuation, velocity factor and connector discontinuity are each included in the matrix solution.

The analysis of the present model-based solution uses, for example, 1000 or more frequency points, in order to include the narrow VSWR spikes over the band of interest. Of course, a different number of frequency points may be employed. A Pentium II-based workstation running Microsoft Windows NT 4.0, having a clock rate of at least 400 MHz, is preferred, as each component is adjusted approximately 10 times. Using this computing hardware configuration, spending eight hours to optimize an eighty segment transmission line system is not unusual.

The input to the computer program is changed to increase and decrease each transmission line segment length, testing its sensitivity to reduce VSWR peaks. Every test, i.e., set of segment lengths, requires a new analysis, i.e., calculation of the entire matrix. The length of each segment is incrementally altered until peaks can not be reduced without levels rising in another area. At the beginning of the process, a 1% change increment in line length is used. Subsequently, the change increments are reduced to 0.1%, and then to 0.01%. Clearly, the choice of decade differences in optimization phases is a matter of engineering choice, and other increments and optimization phase change ratios may be employed as desired. Each transmission line segment is revisited many times during each phase of the analysis. The final, optimized lengths are quite different from those putative values present early in the analysis. The limit to reduction of the peaks is similar reaching to the RMS value of the trace.

As a result of the optimization according to the present invention, the spacing of line lengths is highly non-linear. For example, in a system having 80 segments, the increment in lengths varies from 0.7 (I1–I2) to 0 (I46–I47), as compared to a length increment calculated according to U.S. Pat. No. 5,455,548, which would be 0.759. Likewise, in a 20 segment example, the increment in length varies from 2.38 (I19–I20) to 0.15 (I10–I11).

The present invention therefore provides a non-progressive sequence of line lengths. Further, an analysis of the resulting line lengths fails to reveal a mere superposition of progressive sequences and/or other identifiable sequences. Therefore, no simple formula describes the desired section lengths, and the recursive calculations must be replicated under each set of circumstances. The system and method according to the present invention also distinguish an essentially random distribution of line lengths, in that the line lengths produced by the present method are reproducible and derived algorithmically.

It is noted that the simulation or model of the transmission line system preferably also includes associated components, such as elbows, short lengths, line supports (discs or cross pins formed of Teflon®), U-links, antennas, filters (cavity filters, combiners, diplexers, multiplexers, power dividers, Gysel-type systems), etc., and therefore each component must be modeled (e.g., using s-parameters) and represented. Typically, only the long line segments will be varied for optimization, although if other components have a significant detrimental effect on the performance, these may be varied, tuned or substituted as well.

It is therefore an object of the invention to provide a method for optimizing a set of transmission line segment lengths, and associated components, employing a linear circuit simulation of the transmission line with a computer algorithm to optimize the line lengths.

It is a further object of the invention to provide a method for optimizing VSWR characteristics over a frequency band by providing a model of performance of the system, and sequentially altering component characteristics within the system until an optimum solution is reached.

It is another object of the invention to provide a linear model for a segmented coaxial transmission line describing VSWR performance thereof.

These and other objects and features of the present invention will become more fully apparent from the following description and appended claims taken in conjunction with the accompanying drawings.

BRIEF DESCRIPTION OF THE DRAWINGS

For a better understanding of the invention, reference is made to the drawings, which are to be taken in conjunction with the detailed specification to follow.

DETAILED DESCRIPTION OF THE PREFERRED EMBODIMENTS

Figure 1:
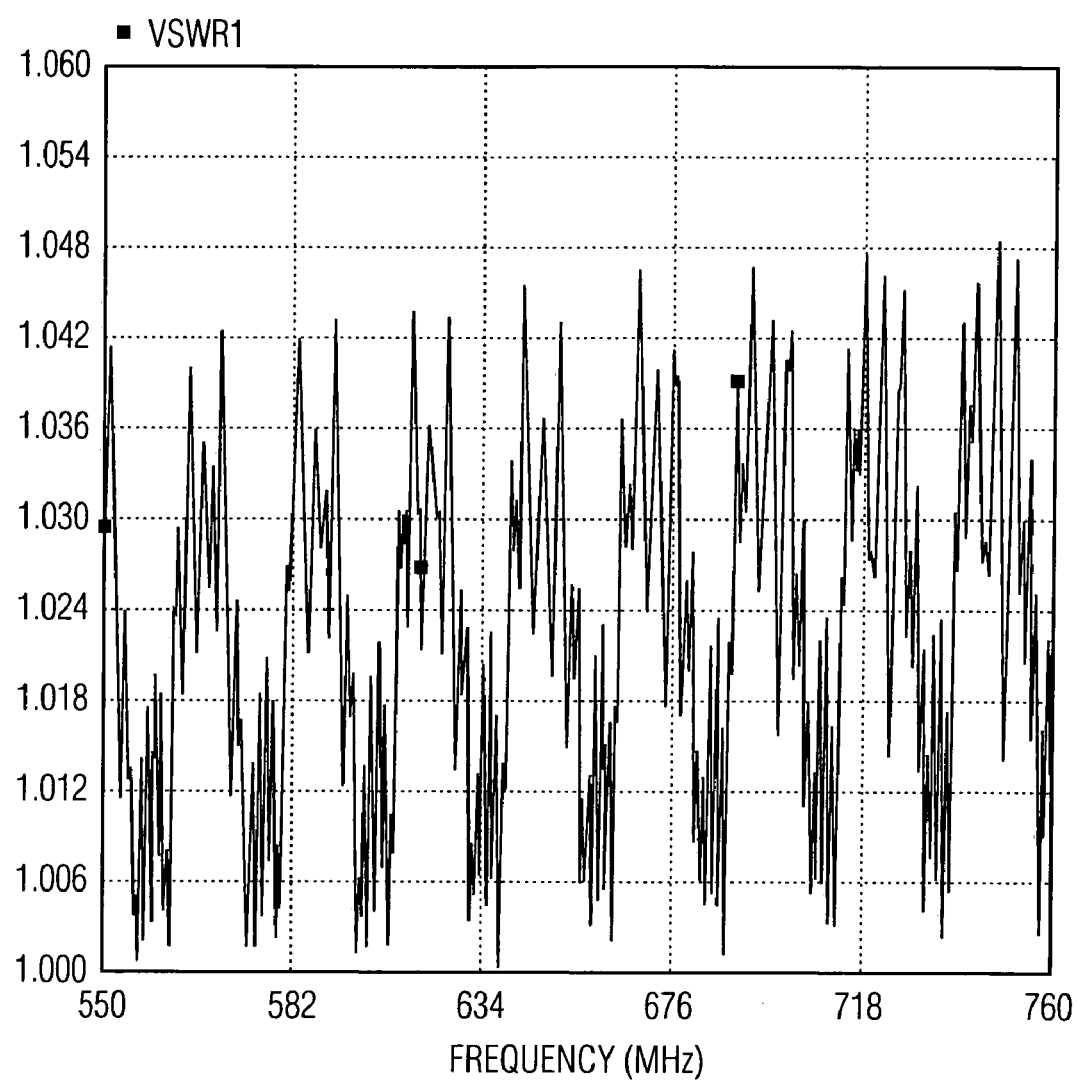
FIGS. 1 and 2 show, respectively, calculated VSWR plots for a progressive distribution of line segment lengths for 20 and 80 segments according to the prior art, respectively.

The invention will now be described by way of the drawings, in which corresponding reference numerals indicate corresponding structures in the figures.

The present invention provides a recursive method for optimizing the line lengths of a segmented transmission line, employing a model of performance and at least one optimization parameter for directing the optimization process.

The procedure begins by building a model of the transmission line, using parameters describing the performance of each component, as well as the length dependency of the parameters. The model is preferably evaluated on a general purpose computer, such as an Intel Pentium-II, 400 MHz based engineering workstation. The number of segments is preferably predetermined, while the algorithm optimizes the length of each segment of the transmission line, within specified parameters. More complex analyses may place fewer predefined constraints on the optimization process. Each line length is then adjusted according to predefined criteria, i.e., an incremental value, until a minimum overall reflection coefficient is obtained. The adjustment may also proceed in phases, wherein the incremental value changes between phases. In a preferred embodiment, the first phase provides a 1% incremental change in length for each pass in the phase, with successive phases having a respective order or magnitude decrease in incremental change, e.g., a three phase analysis with a final phase increment of 0.01%. It has been found that the response of an optimized segmented transmission according to the present invention is always better than a fixed incremental length progression segmented transmission line, such as that proposed by U.S. Pat. No. 5,455,548.

EXAMPLE 1

From the aforementioned method, assuming 80 lengths ranging between 241 to 232 inches each, optimized over the UHF band from 550 to 760 MHz, the transmission line lengths set forth in Table 1 are obtained:

TABLE 1

L1 = 240.00
L2 = 240.70
L3 = 240.46

TABLE 1-continued

L4 = 239.77
L5 = 239.67
L6 = 239.43
L7 = 239.54
L8 = 239.20
L9 = 239.39
L10 = 239.31
L11 = 239.24
L12 = 239.16
L13 = 239.08
L14 = 239.01
L15 = 238.93
L16 = 238.86
L17 = 238.78
L18 = 238.60
L19 = 238.61
L20 = 238.57
L21 = 238.50
L22 = 238.37
L23 = 238.34
L24 = 238.45
L25 = 237.40
L26 = 238.67
L27 = 237.78
L28 = 237.65
L29 = 237.39
L30 = 238.09
L31 = 237.72
L32 = 237.64
L33 = 237.56
L34 = 237.49
L35 = 237.41
L36 = 237.34
L37 = 237.02
L38 = 237.18
L39 = 237.11
L40 = 237.27
L41 = 237.20
L42 = 237.14
L43 = 236.81
L44 = 236.73
L45 = 236.70
L46 = 236.50
L47 = 236.50
L48 = 236.67
L49 = 236.11
L50 = 236.03
L51 = 235.67
L52 = 236.12
l53 = 236.05
L54 = 235.97
L55 = 235.89
L56 = 235.82
L57 = 235.74
L58 = 235.67
L59 = 235.59
L60 = 235.51
L61 = 235.44
L62 = 235.36
L63 = 235.29
L64 = 235.21
L65 = 235.11
L66 = 235.02
L67 = 234.98
L68 = 234.91
L69 = 234.85
L70 = 234.75
L71 = 234.68
L72 = 234.60
L73 = 234.53
L74 = 234.45
L75 = 234.37
L76 = 234.30
L77 = 234.22
L78 = 234.15
L79 = 234.07
L80 = 233.98

These lengths and their distribution are significantly different from those obtained by the method of U.S. Pat. No. 5,455,548, which are progressively spaced at 6/79=0.0759 inch increments. Thus, for the $23^{rd}$ segment, the length would be 240−(6/79)×(23−1).=238.329.

Even greater reductions of reflection coefficients using computer analysis are realized with systems of fewer line sections (50, 30 and 20). It has also been found that other lengths, contrary to those predicted by an incremental progression formula, are essential in design of reduced reflection coefficient transmission line systems.

From the aforementioned method, assuming 20 lengths ranging between 241 to 232 inches each, optimized over the UHF band from 550 to 760 MHz, the transmission line lengths set forth in Table 2 are obtained:

TABLE 2

L1 = 240.00
L2 = 239.80
L3 = 239.51
L4 = 240.05
L5 = 238.63
L6 = 238.24
L7 = 237.68
L8 = 238.30
L9 = 237.49
L10 = 236.75
L11 = 236.60
L12 = 237.04
L13 = 236.09
L14 = 235.16
L15 = 234.93
L16 = 235.88
L17 = 234.37
L18 = 232.95
L19 = 233.54
L20 = 235.92

The initial lengths used in the model evolve from a presumption, based on experience, of the line lengths required to satisfy channel occupancy, without reflection from flange buildup. This just happens to be 6 inches, and has been published in major manufactures catalogs for the last 30 years. In fact, the equation set forth in U.S. Pat. No. 5,455,548, arrives at the same value.

Four figures are included that demonstrate the results of two methods. The VSWR, a more common practice of presenting reflection coefficient, is plotted against the frequency band of interest. The transmission line model includes line length, stepped impedance, attenuation dielectric constant, and capacitive discontinuity at each connector.

Figure 2:
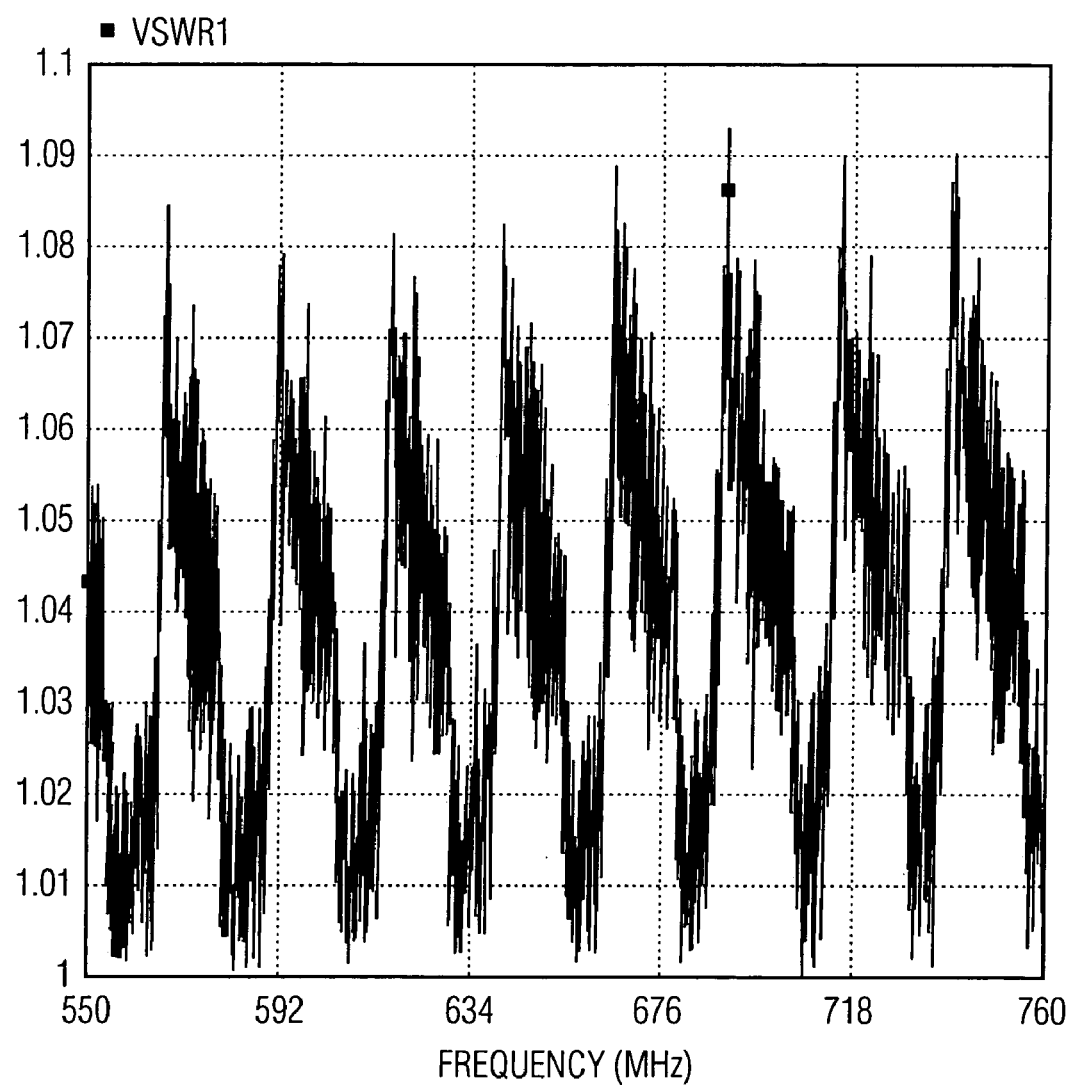
Figure 3:
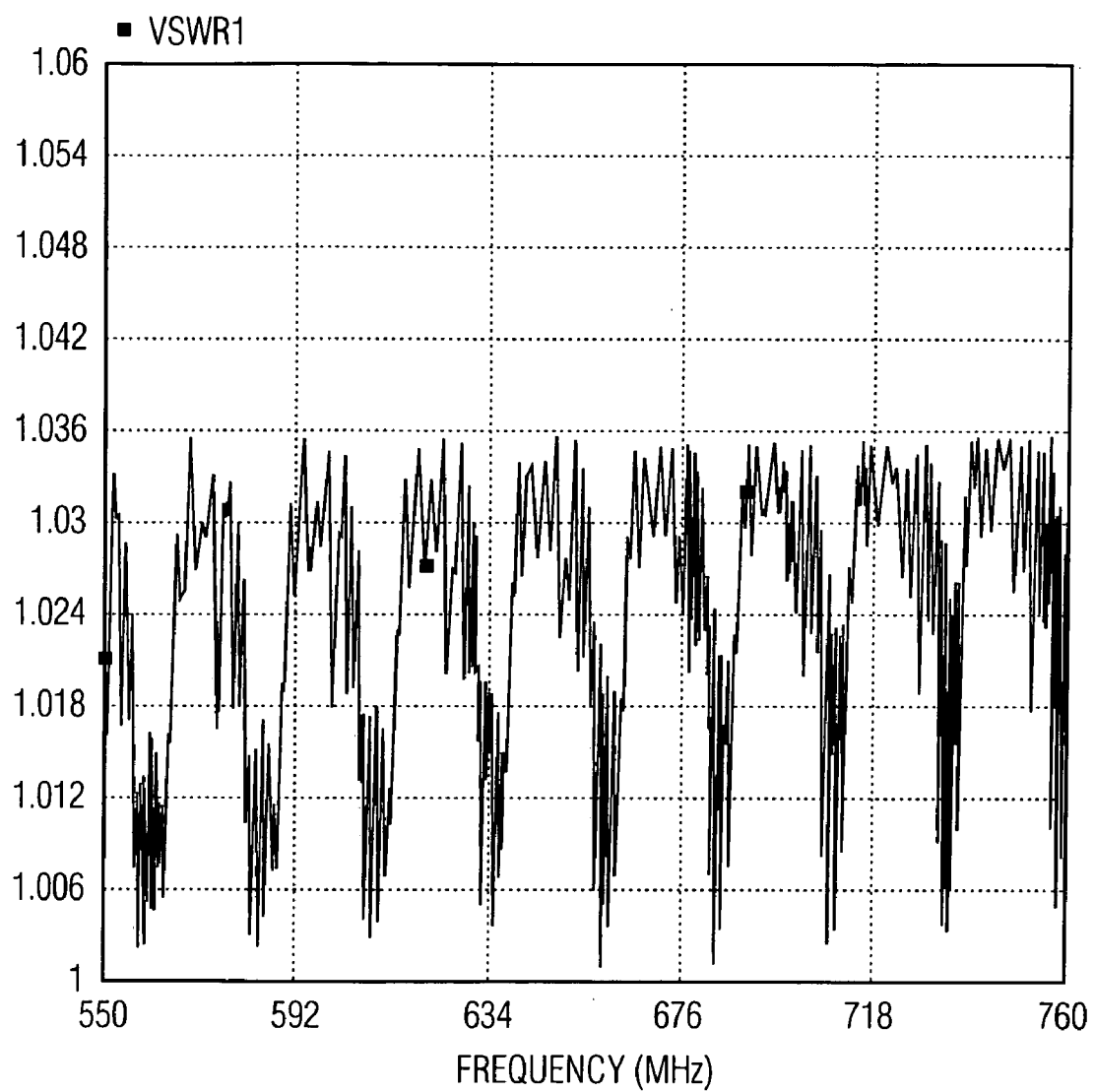
FIGS. 3 and 4 show, respectively, calculated VSWR plots for optimized an distribution of line segment lengths for 20 and 80 segments according to the present invention, respectively.
Figure 4:
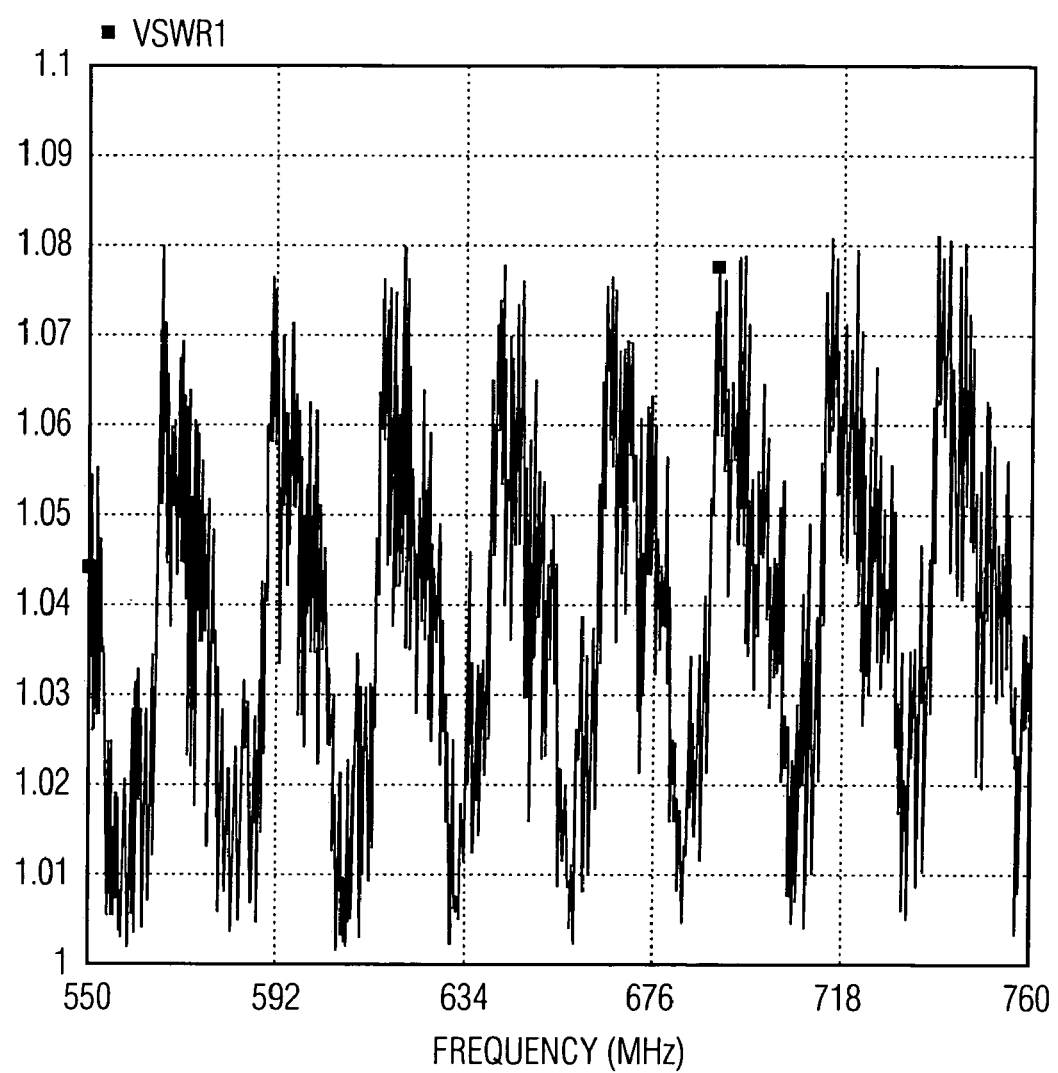

As shown in FIGS. 1 and 2, an essentially progressive distribution of line lengths results in a VSWR peaks of over 1.093 (80 segments) and 1.049 (20 segments). In contrast, corresponding graphs for the optimized segment lengths according to the present invention have peak VSWR of 1.082 (80 segments) and 1.035 (20 segments).

EXAMPLE 2

A test was conducted of an approximately 614 foot long copper coaxial rigid transmission line, 75 Ohm 6⅛ inch diameter, composed of 31 sections, 29 vertical and 2 horizontal, with standard connectors and one Spectraline® full band elbow. Respective line lengths were optimized using computer analyses to select the best set of lengths, based on models of the individual line sections, connectors and elbow. The line segment lengths shown in Table 3 resulted.

TABLE 3

| | |
|---|---|
| L1 | 240.00 |
| L2 | 240.50 |
| L3 | 240.50 |
| L4 | 239.43 |
| L5 | 240.31 |
| L6 | 240.23 |
| L7 | 239.62 |
| L8 | 239.56 |
| L9 | 240.01 |
| L10 | 237.31 |
| L11 | 239.48 |
| L12 | 239.88 |
| L13 | 238.24 |
| L14 | 238.67 |
| L15 | 238.67 |
| L16 | 237.76 |
| L17 | 237.72 |
| L18 | 237.56 |
| L19 | 237.14 |
| L20 | 236.42 |
| L21 | 236.42 |
| L22 | 235.84 |
| L23 | 234.10 |
| L24 | 235.03 |
| L25 | 236.16 |
| L26 | 235.62 |
| L27 | 234.40 |
| L28 | 233.32 |
| L29 | 233.80 |
| Elbow | 10.00 |
| L30 | 237.06 |
| L31 | 233.06 |

The total length is 7373.82 inches, or 614.485 feet.

Figure 5:
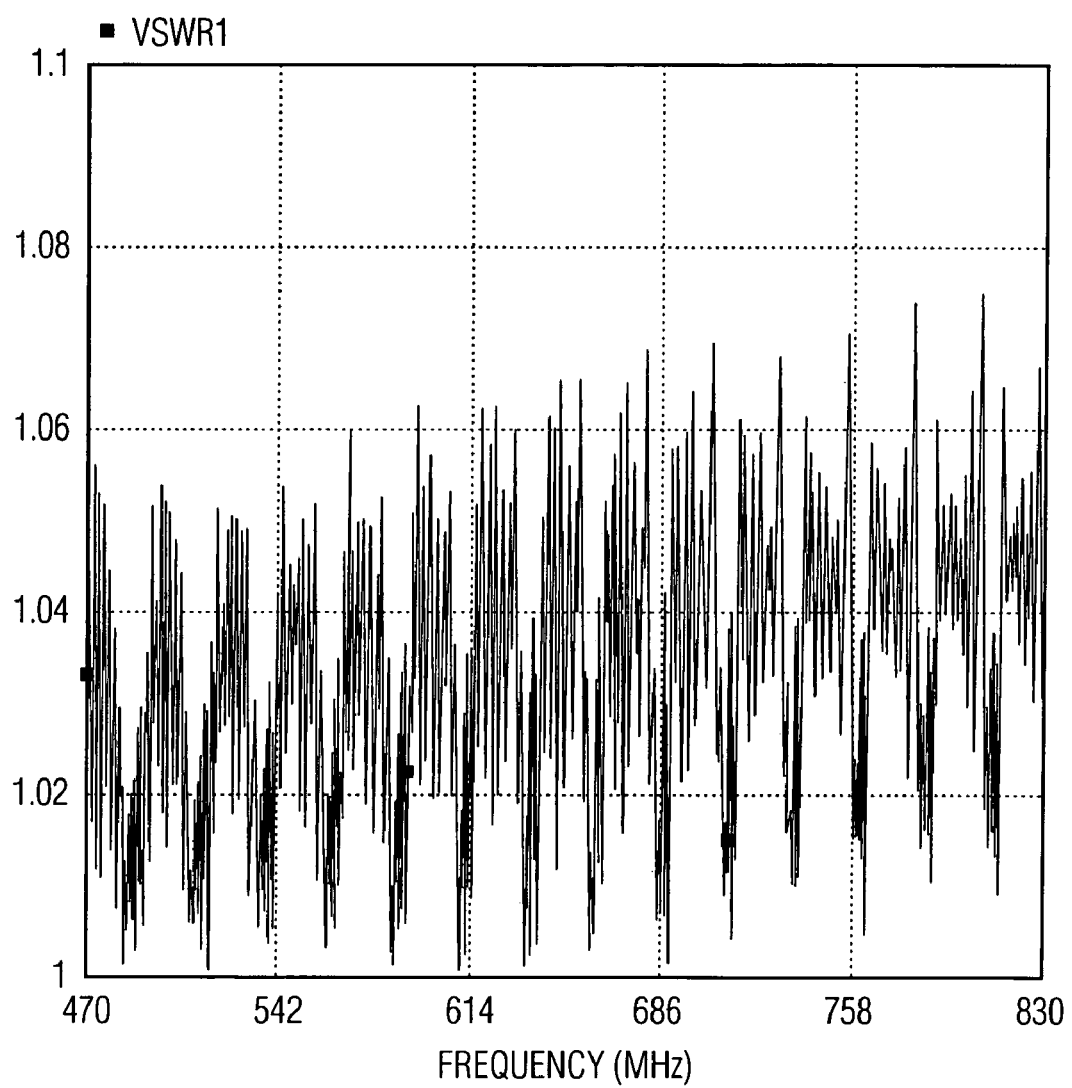
FIGS. 5, 6 and 7 shown respectively, a calculated VSWR plots for a progressive distribution, and calculated VSWR and return loss plots for an optimized distribution of line lengths for a 614 foot, 31 segment transmission line with an elbow.
Figure 6:
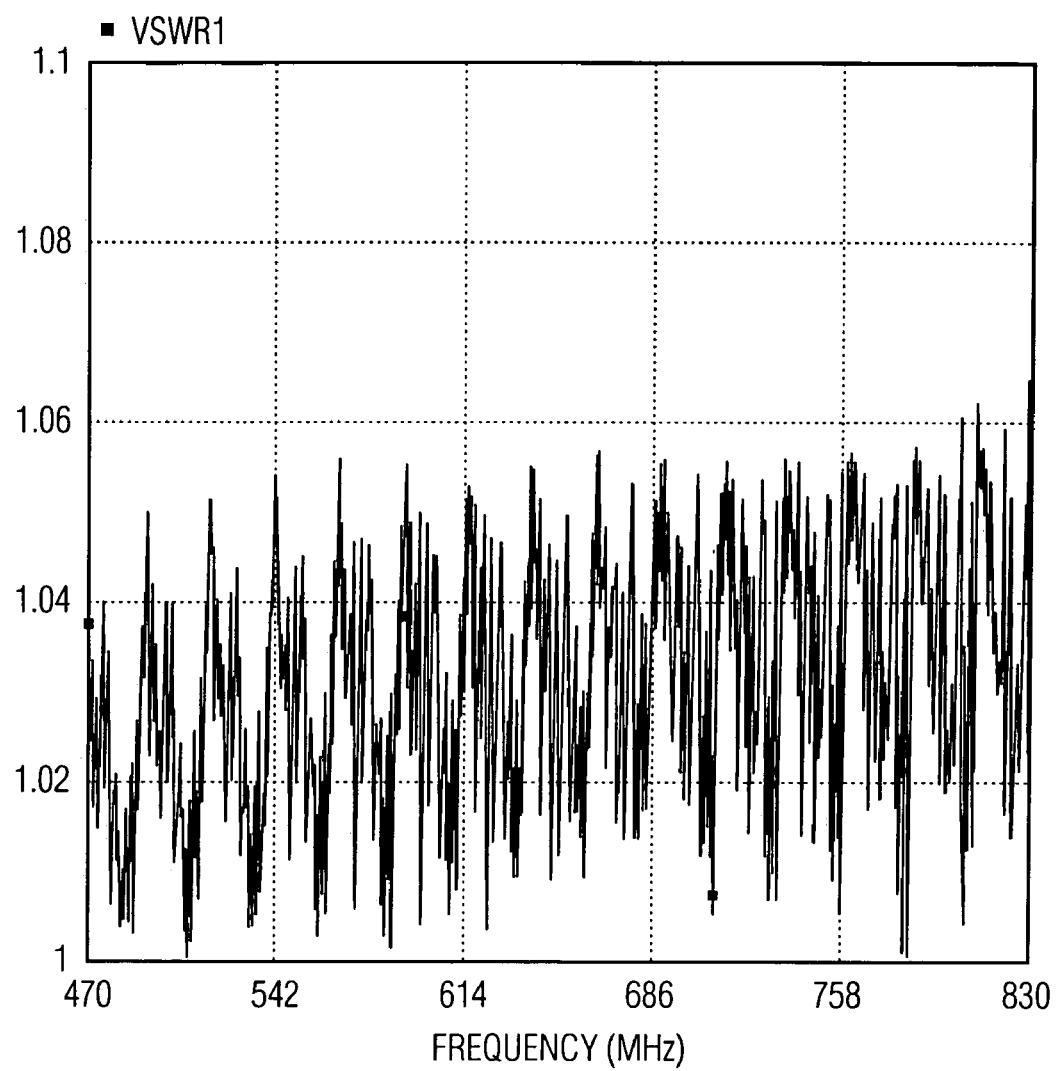
Figure 7:
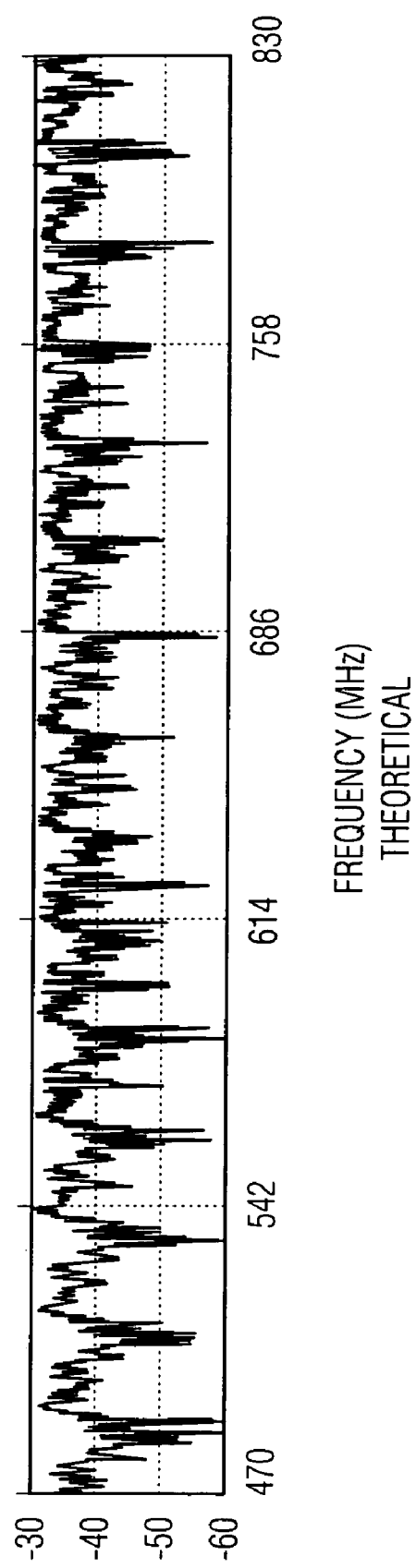
Figure 8:
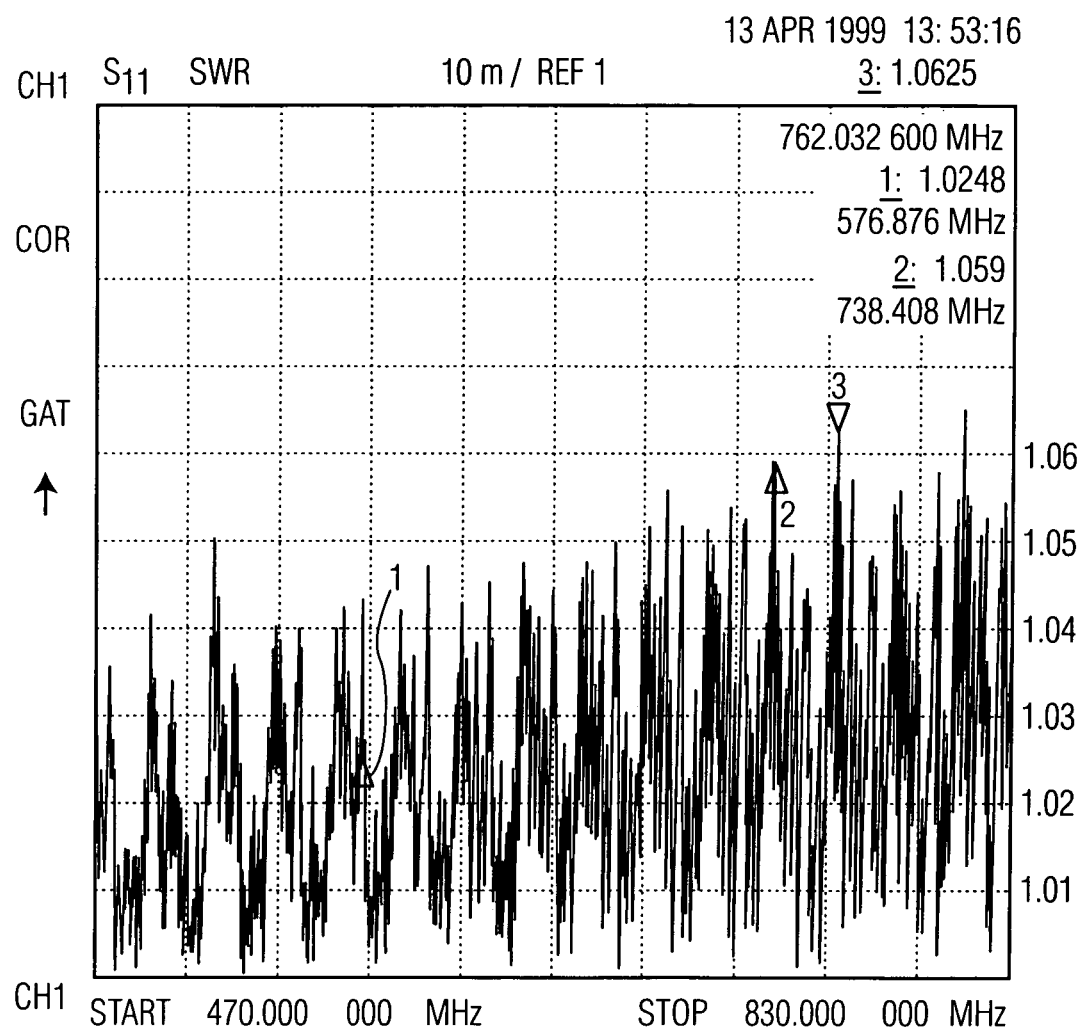
FIGS. 8 and 9 show, respectively, measured VSWR and return loss for an optimized distribution of line lengths implementation of the transmission line of FIGS. 6 and 7
Figure 9:
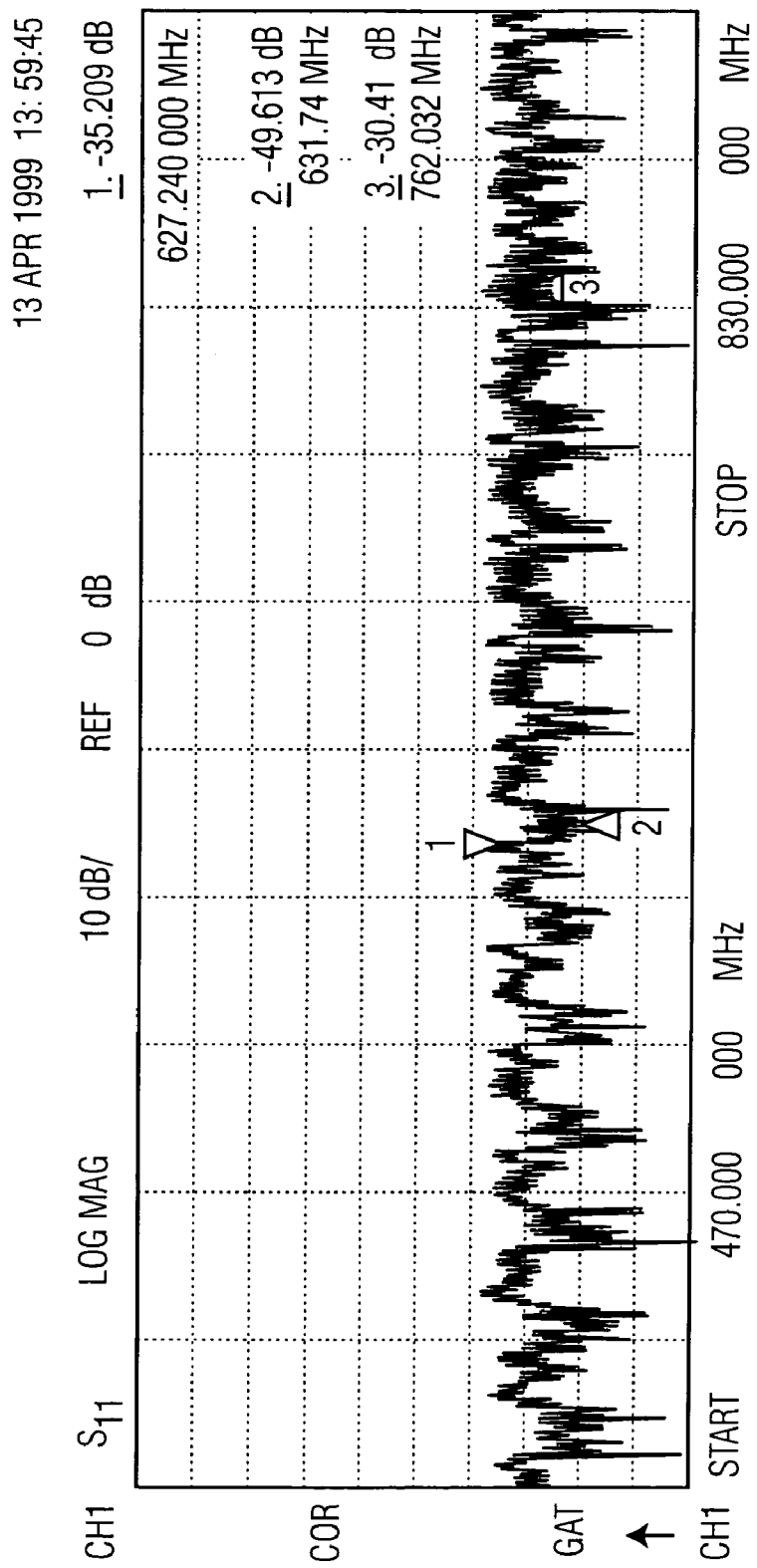
Figure 10:
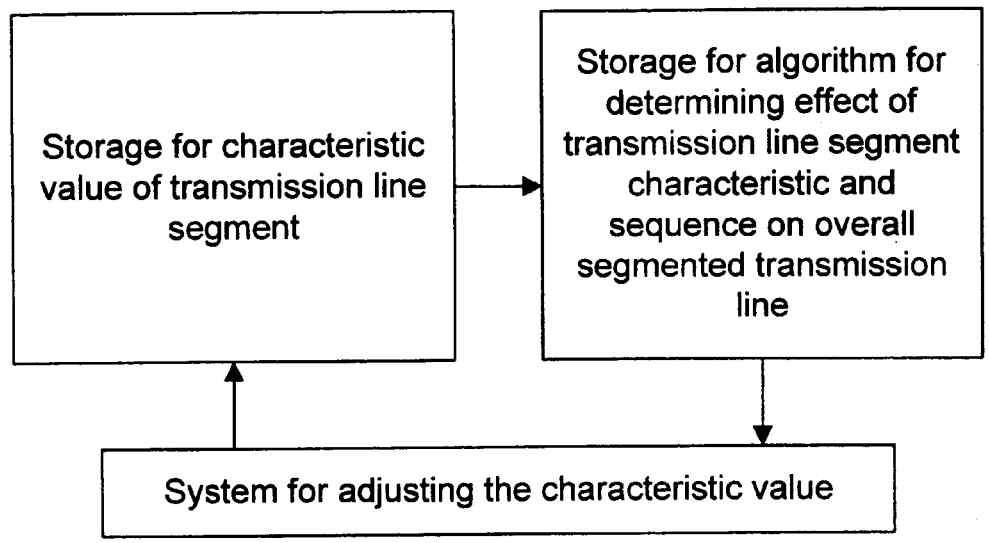
FIG. 10 shows a generic model according to the present invention for optimizing a segmented transmission line characteristic.
Figure 11:
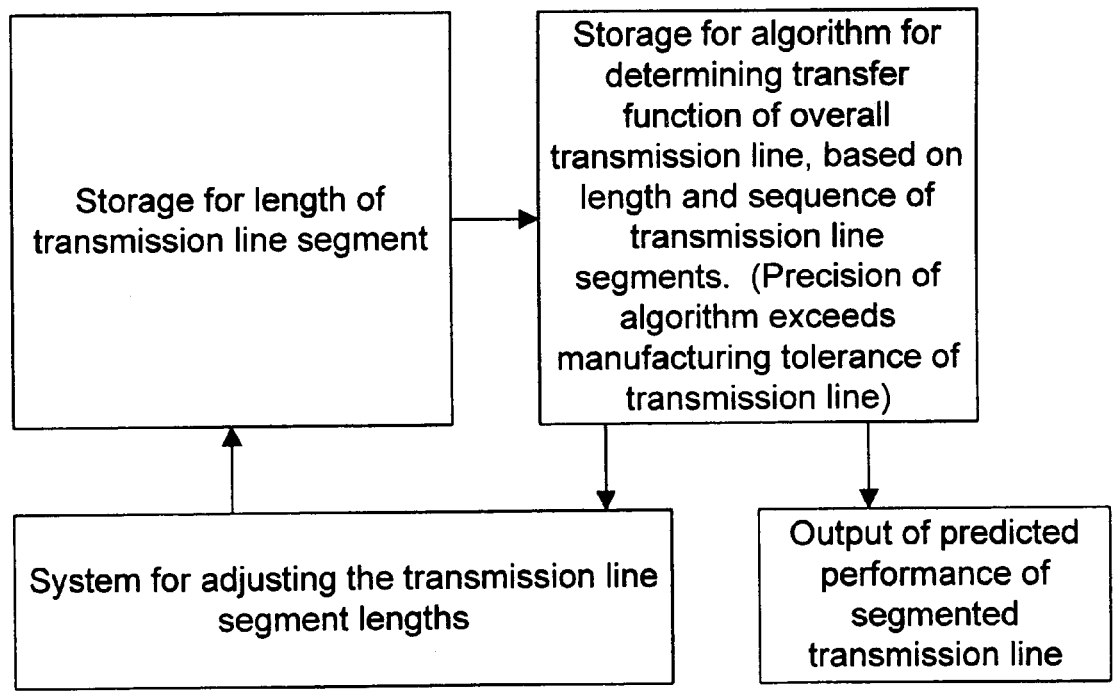
FIGS. 11–12 show amplifications and preferred embodiments of the generic model shown in FIG. 9.
Figure 12:
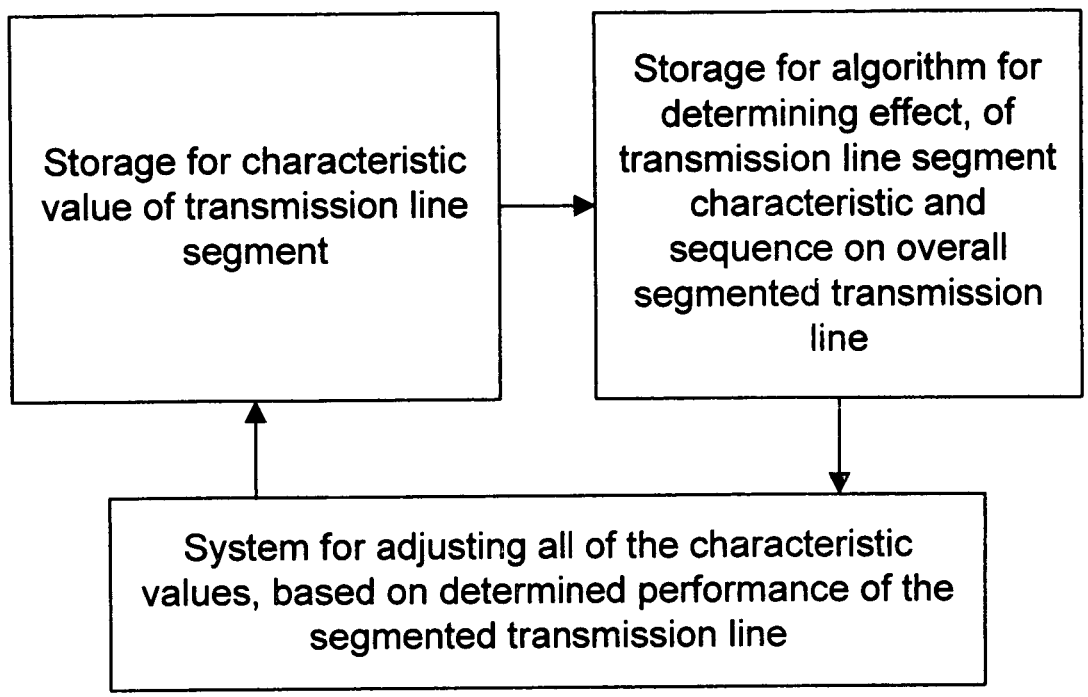
Figure 13:
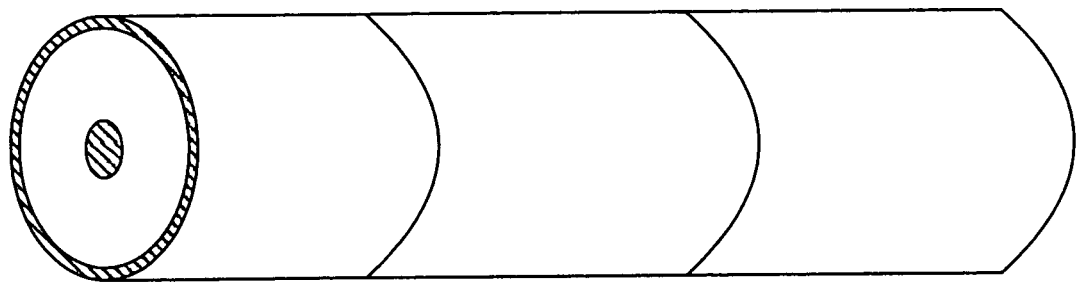
FIG. 13 shows a perspective view of an air-spaced, segmented, coaxial transmission line.
Figure 14:
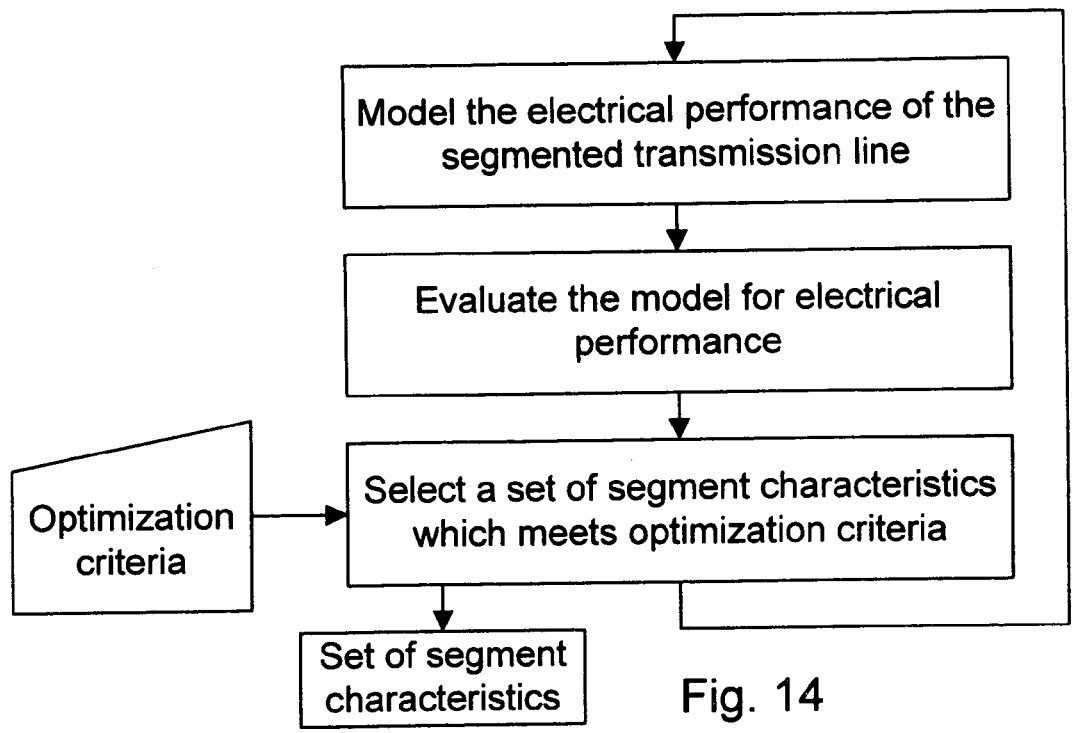
FIG. 14 shows a flowchart detailing a generic method according to the present invention for optimizing a segmented transmission line characteristic.
Figure 15:
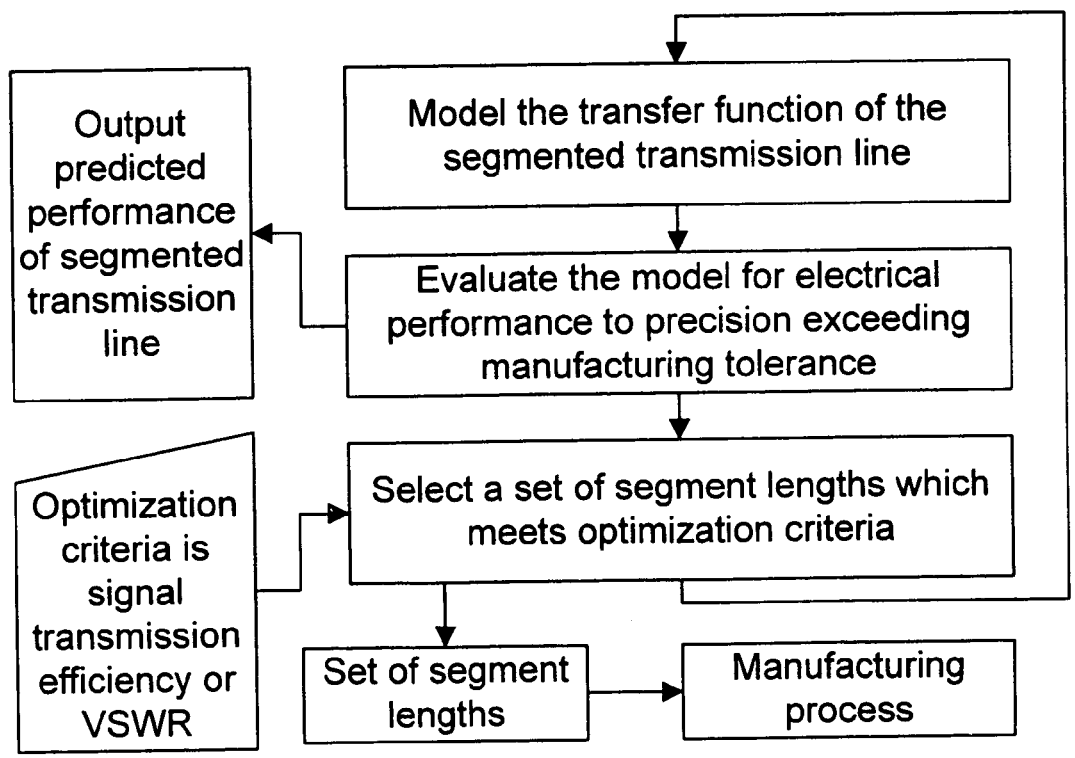
FIG. 15 shows a flowchart detailing a more detailed flowchart representing preferred embodiments of the invention.

FIGS. 5 and 6 show the calculated VSWR for a progressive distribution and optimized line segment length according to Table 3, including the elbow between the $29^{th}$ and $30^{th}$ segments. As can be seen, the calculated performance of the system according to the present invention is superior to the progressive line length system. Comparing FIGS. 6 and 7, which represent calculated VSWR and return loss plots, to 8 and 9, which represent measured VSWR and return loss plots, respectively, it is further seen that the measured performance of the transmission line is comparable to the calculated performance, thereby verifying the usefulness of the model in predicting actual electrical performance.

It has been found that a precision in calculation of optimal line lengths or manufacturing tolerances need not be greater than 0.030".

The inventors hereof have therefore found that by calculating the vector algebra results for various line lengths as part of the optimization process, rather than the known simple arithmetic division of lengths, a significant improvement in performance may be obtained.

There has thus been shown and described novel structures and methods for selecting line sublengths and optionally associated components which fulfill all the objects and advantages sought therefor. Many changes, modifications, variations, combinations, subcombinations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. A computer model for describing a performance of a segmented transmission line having a plurality of segments, each segment having a transfer function, comprising:
   (a) means for storing at least one characteristic value the transfer function of a respective segment of the segmented transmission line;
   (b) means for storing information relating to at least one algorithm, said algorithm being for determining the effect of a respective characteristic value and sequence of transmission line segments on a performance of the overall segmented transmission line; and
   (c) means for adjusting a characteristic value,
   whereby a set of characteristic values is defined for respective transmission line segments, having an optimized performance in view of the at least one algorithm.

2. The model according to claim 1, wherein the characteristic value is a length of a respective transmission line segment.

3. The model according to claim 1, wherein the at least one algorithm calculates a transfer function of the segmented transmission line.

4. The model according to claim 1, wherein the adjusting means allows adjustment of all characteristic values, the adjustments being based on a determined performance of the segmented transmission line.

5. The model according to claim 1, wherein the segmented transmission line comprises an air-spaced coaxial transmission line adapted for transmitting an RF signal, the performance comprising signal transmission efficiency.

6. The model according to claim 1, wherein a precision of the algorithm exceeds a manufacturing tolerance of the segmented transmission line.

7. The model according to claim 1, further comprising means for outputting a predicted performance of the segmented transmission line based on the respective characteristic values.

8. The model according to claim 1, wherein the respective characteristic values are non-incrementally distributed across a range.

9. The model according to claim 1, wherein the respective characteristic values are non-monotonically distributed across a range.

10. A computer implemented method for optimizing the segment characteristics of a segmented transmission line, comprising the steps of modeling the electrical performance of the segmented transmission line, evaluating the model for electrical performance, selecting an optimally ordered set of independently-selected segment characteristics, based on the evaluation, which meets a set of predefined optimization criteria, and at least one of (1) producing a computer-generated output representing the set of segment characteristics, and (2) producing a segmented transmission line having the set of segment characteristics.

11. The method according to claim 10, wherein the set of segment characteristics comprises a respective length of each segment.

12. The method according to claim 10, wherein the model is evaluated to determine a transfer function of the segmented transmission line.

13. The method according to claim 10, wherein the segmented transmission line comprises an air-spaced coaxial transmission line adapted for transmitting an RF signal, the predefined optimization criteria comprising signal transmission efficiency.

14. The method according to claim 10, wherein a precision of the evaluation exceeds a manufacturing tolerance of the segmented transmission line.

15. The method according to claim 10, further comprising outputting a predicted performance of the segmented transmission line based on the respective segment characteristics.

16. The method according to claim 10, further comprising the step of producing a set of transmission line segments according to the selected segment characteristics.

17. A segmented transmission line, produced according to claim 16, wherein the segment characteristic comprises a respective segment length and the optimization criteria comprises a minimization of worst case VSWR over a radio frequency band.

18. A segmented transmission line, produced according to claim 16, wherein the segmented transmission line comprises an air-spaced coaxial transmission line adapted for transmitting an RF signal; the segment characteristic comprises a respective segment length; and the optimization criteria comprises a minimization of worst case VSWR over a radio frequency band.

19. A computer system for describing a performance of a segmented transmission line having a plurality of segments, each segment having a transfer function, comprising:
(a) a memory location storing at least one characteristic value the transfer function of a respective segment of the segmented transmission line;
(b) a memory location storing information relating to at least one algorithm, said algorithm being for determining the effect of a respective characteristic value and sequence of transmission line segments on a performance of the overall segmented transmission line; and
(c) a processor, executing a program for iteratively adjusting a set of characteristic values for respective transmission line segments to achieve an optimized performance within a predetermined performance constraint with respect to the at least one algorithm.

20. The system according to claim 19, wherein a variation in characteristic values of segment characteristic values is distributed in a manner selected from the group consisting of non-incrementally and non-monotonically.

21. The method according to claim 20, wherein a variation in respective segment characteristics is distributed non-incrementally.

22. The method according to claim 20, wherein a variation in respective segment characteristics is distributed non-monotonically.

23. The system according to claim 19, wherein the characteristic value is a length of a respective transmission line segment.

24. The system according to claim 19, wherein the performance constraint is selected from the group consisting of a signal transmission efficiency and a VSWR.

25. The system according to claim 19, wherein the segmented transmission line comprises an air-spaced coaxial transmission line adapted for transmitting an RF signal, the characteristic value being a length of a respective transmission line segment, the optimized respective characteristic values being non-incrementally and non-monotonically distributed across a range.

26. A method for optimizing the segment characteristics of a segmented transmission line, comprising the steps of modeling the electrical performance of the segmented transmission line, evaluating the model for electrical performance, selecting a set of segment characteristics, based on the evaluation, which meets a set of predefined optimization criteria, and producing at least one of a computer-generated output of the set of segment characteristics and a segmented transmission line having the set of segment characteristics, wherein a variation in respective segment characteristics is distributed non-incrementally.

27. A method for optimizing the segment characteristics of a segmented transmission line, comprising the steps of modeling the electrical performance of the segmented transmission line, evaluating the model for electrical performance, selecting a set of segment characteristics, based on the evaluation, which meets a set of predefined optimization criteria, and producing at least one of a computer-generated output of the set of segment characteristics and a segmented transmission line having the set of segment characteristics, wherein a variation in respective segment characteristics is distributed non-monotonically.

28. A method for optimizing the segment characteristics of a segmented transmission line, comprising the steps of modeling the sequence-dependent electrical performance of the segmented transmission line, evaluating the model for electrical performance, selecting a set of segment characteristics and sequence, based on the evaluation, which meets a set of predefined optimization criteria, and producing at least one of a computer-generated output of the set of segment characteristics and segment sequence and a segmented transmission line having the set of segment characteristics and segment sequence, wherein said set of segment characteristics is in an optimal order.

29. A computer implemented method for optimizing the segment characteristics of a segmented transmission line, comprising the steps of modeling the electrical performance of the segmented transmission line, iteratively evaluating the model for electrical performance, selecting a set of sequence dependent segment characteristics having a variation of respective segment characteristics distributed in a manner selected from the group consisting of non-incrementally and non-monotonically, based on the evaluation, which meets a set of predefined optimization criteria, and at least one of producing a computer-generated output of the set of segment characteristics and producing a segmented transmission line having the set of segment characteristics.

30. The method according to claim 29, wherein a variation in respective segment characteristics is distributed non-incrementally.

31. The method according to claim 29, wherein a variation in respective segment characteristics is distributed non-monotonically.

* * * * *